United States Patent
Xu et al.

(10) Patent No.: US 12,148,618 B2
(45) Date of Patent: Nov. 19, 2024

(54) MASK STRUCTURE, SEMICONDUCTOR STRUCTURE AND METHODS FOR MANUFACTURING SAME

(71) Applicant: CHANGXIN MEMORY TECHNOLOGIES, INC., Hefei (CN)

(72) Inventors: Penghui Xu, Hefei (CN); Qiang Wan, Hefei (CN); Tao Liu, Hefei (CN); Sen Li, Hefei (CN); Jun Xia, Hefei (CN); Kangshu Zhan, Hefei (CN); Jinghao Wang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 406 days.

(21) Appl. No.: 17/647,993

(22) Filed: Jan. 14, 2022

(65) Prior Publication Data

US 2022/0310393 A1 Sep. 29, 2022

Related U.S. Application Data

(63) Continuation of application No. PCT/CN2021/105740, filed on Jul. 12, 2021.

(30) Foreign Application Priority Data

Mar. 29, 2021 (CN) .......................... 202110333446.6

(51) Int. Cl.
*H01L 21/033* (2006.01)
*H10B 12/00* (2023.01)

(52) U.S. Cl.
CPC ...... *H01L 21/0338* (2013.01); *H01L 21/0335* (2013.01); *H01L 21/0337* (2013.01); *H10B 12/00* (2023.02)

(58) Field of Classification Search
CPC ............. H01L 21/0338; H01L 21/0335; H01L 21/0337; H01L 21/31144; H10B 12/00; H10B 12/033
See application file for complete search history.

(56) References Cited

U.S. PATENT DOCUMENTS 8,623,770 B1 * 1/2014 Gao .................... H01L 21/0337
438/785
9,012,326 B2 * 4/2015 Kim .................. H01L 29/66666
257/E21.585

(Continued)

FOREIGN PATENT DOCUMENTS

CN          103390544 A     11/2013
CN          108206131 A     6/2018
(Continued)

OTHER PUBLICATIONS

International Search Report in PCT/CN2021/105740 mailed Jan. 6, 2022, 9 pages.

*Primary Examiner* — Kyoung Lee
*Assistant Examiner* — Sophia W Kao
(74) *Attorney, Agent, or Firm* — Kilpatrick Townsend & Stockton LLP

(57) ABSTRACT

A mask structure, a semiconductor structure and methods for manufacturing the same are disclosed. The method for manufacturing the mask structure includes: forming a pattern transfer layer, a first etching stop layer, a first sacrificial layer and a first hard mask layer sequentially stacked from bottom to top; patterning the first sacrificial layer and the first hard mask layer, to obtain a first sacrificial pattern, the first sacrificial pattern exposing the first etching stop layer; forming a first initial mask pattern on side walls of the first sacrificial pattern; removing the first sacrificial pattern; removing, based on the first initial mask pattern, a part of the first etching stop layer of which a top surface being exposed;

(Continued)

removing the first initial mask pattern, and using the remaining part of the first etching stop layer on the upper surface of the pattern transfer layer as a first mask pattern.

17 Claims, 6 Drawing Sheets

(56) References Cited

U.S. PATENT DOCUMENTS

| | | |
|---|---|---|
| 9,548,243 B1 | 1/2017 | Briggs et al. |
| 2016/0225634 A1 | 8/2016 | Anderson et al. |

FOREIGN PATENT DOCUMENTS

| | | | |
|---|---|---|---|
| CN | 108695152 A | 10/2018 | |
| CN | 109686665 A | 4/2019 | |
| CN | 110571139 A | 12/2019 | |
| CN | 108010966 B | 8/2020 | |
| CN | 112133625 A | 12/2020 | |
| CN | 113097139 A | 7/2021 | |
| CN | 110571139 B | * 10/2021 | ......... H01L 21/0337 |

* cited by examiner

MASK STRUCTURE, SEMICONDUCTOR STRUCTURE AND METHODS FOR MANUFACTURING SAME

CROSS-REFERENCE TO RELATED APPLICATIONS

This is a continuation of International Application No. PCT/CN2021/105740, filed on Jul. 12, 2021, which claims the priority to Chinese Patent Application 202110333446.6, titled "MASK STRUCTURE, SEMICONDUCTOR STRUCTURE AND METHODS FOR MANUFACTURING SAME" and filed on Mar. 29, 2021. The entire contents of International Application No. PCT/CN2021/105740 and Chinese Patent Application 202110333446.6 are incorporated herein by reference.

TECHNICAL FIELD

The present disclosure relates to the manufacturing field of integrated circuits and electronic components, and in particular to, a mask structure, a semiconductor structure and methods for manufacturing the same.

BACKGROUND

With the rapid development of semiconductor storage technology, the market has put forward higher requirements for the storage capacity of semiconductor storage products. For Dynamic Random Access Memory (DRAM), the distribution density of memory capacitors and the storage power of a single capacitor restrict the storage capacity and stability of the capacitor memory.

However, when a capacitor hole pattern of a traditional memory capacitor is defined by Self-Aligned Double Patterning (SADP), two layers of mask patterns formed may have asymmetrical topographies, which will affect the etching of an underlying film; and due to the load effect caused by the difference in the material selection ratio, a depth difference occurs on two sides of the obtained mask patterns. However, a capacitor hole manufactured by etching a material layer downward with using the mask patterns with asymmetrical topographies and a depth difference as a mask is inconsistent in direction and prone to dislocation, and as the size of DRAM decreases, the above problems will further deteriorate.

SUMMARY

According to some embodiments, a mask structure, a semiconductor structure and methods for manufacturing the same are provided.

A method for manufacturing a mask structure includes:
forming a pattern transfer layer, a first etching stop layer, a first sacrificial layer and a first hard mask layer sequentially stacked from bottom to top;
patterning the first sacrificial layer and the first hard mask layer, to obtain a first sacrificial pattern, the first sacrificial pattern exposing the first etching stop layer;
forming a first initial mask pattern on side walls of the first sacrificial pattern;
removing the first sacrificial pattern;
removing, based on the first initial mask pattern, a part of the first etching stop layer of which a top surface being exposed;
removing the first initial mask pattern, and using a remaining part of the first etching stop layer on an upper surface of the pattern transfer layer as a first mask pattern, the first mask pattern extending in a first direction; and
forming a second mask pattern on the first mask pattern, the second mask pattern extending in a second direction, and the second direction intersecting the first direction.

A method for manufacturing a semiconductor structure includes:
providing a substrate;
forming a to-be-etched material layer on the substrate;
manufacturing a target mask pattern on upper surface of the to-be-etched material layer by using the above-mentioned method for manufacturing a mask structure; and
etching the to-be-etched material layer based on the target mask pattern, to form a plurality of blind holes.

A semiconductor structure is obtained by the above-mentioned method for manufacturing a semiconductor structure.

The above description is only an overview of the technical solutions of the present disclosure. In order to understand the technical means of the present disclosure more clearly and implement the same in accordance with the content of the specification, the preferred embodiments of the present disclosure are described in detail below with reference to the accompanying drawings.

BRIEF DESCRIPTION OF THE DRAWINGS

In order to describe the technical solutions of the embodiments of the present application more clearly, the following briefly introduces the accompanying drawings required for describing the embodiments. Apparently, the accompanying drawings in the following description show only some embodiments of the present application, and those of ordinary skill in the art may still derive drawings of other embodiments from these accompanying drawings without any creative efforts.

DETAILED DESCRIPTION

Figure 1:
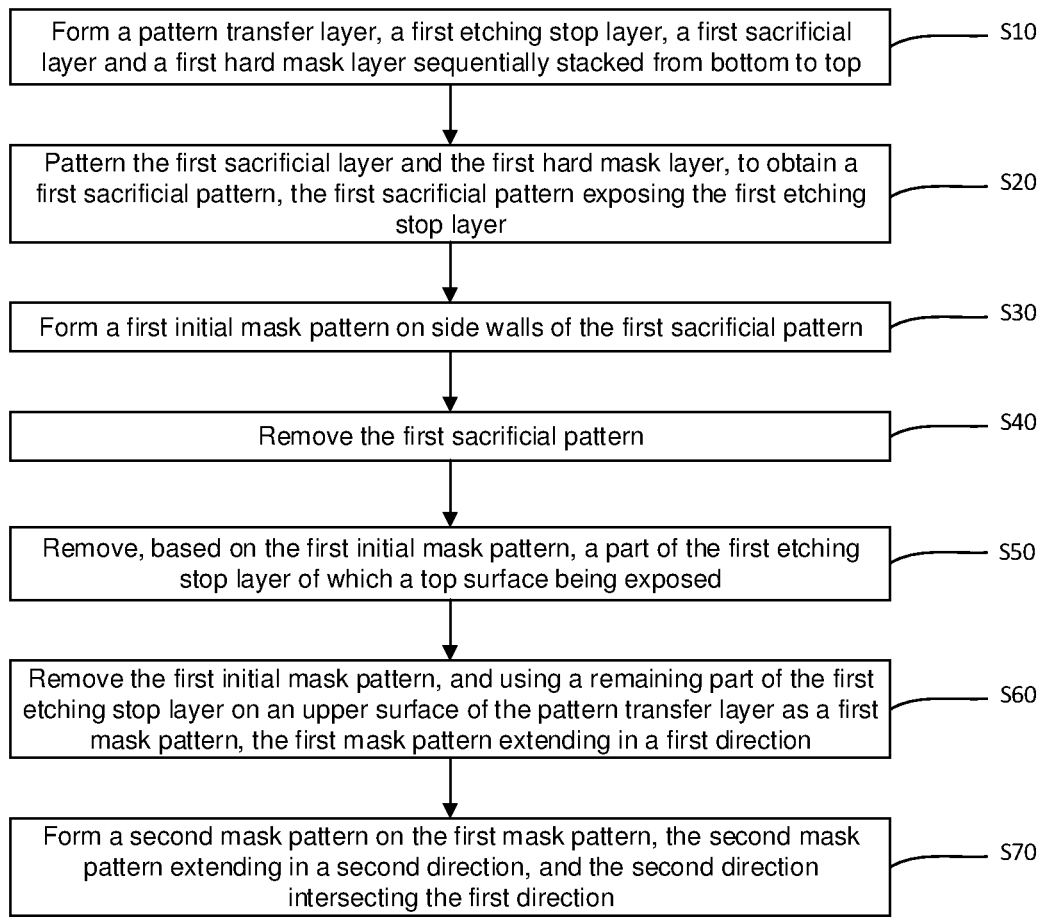
FIG. 1 is a schematic flowchart of a method for manufacturing a mask structure provided in an embodiment of the present application.

In order to facilitate the understanding of the present application, the present application will be described more comprehensively below with reference to the relevant accompanying drawings. Preferred embodiments of the present application are given in the drawings. However, the present application may be implemented in many different forms, and is not limited to the embodiments described herein. Rather, these embodiments are provided so that the disclosure of the present application is more thorough and comprehensive.

Unless otherwise defined, all technological and scientific terms used herein have the same meanings as commonly understood by those of ordinary skill in the technical field of the present application. The terms used in the description of the present application are only for the purpose of describing specific embodiments, but are not intended to limit the present application. The term "and/or" used herein comprises any and all combinations of one or more relevant listed items.

It should be understood that, when an element or layer is referred to as being "on", "adjacent to", "connected to", or "coupled to" other element or layer, the element or layer may be directly on, adjacent to, connected to, or coupled to the other element or layer, or there may be an intermediate element or layer therebetween. In contrast, when an element is referred to as being "directly on", "directly adjacent to", "directly connected to", or "directly coupled to" other element or layer, there is no intermediate element or layer therebetween. It should be understood that, although the terms first, second, third, etc. may be used to describe various elements, components, regions, layers and/or portions, these elements, components, regions, layers and/or portions should not be restricted by these terms. These terms are only used to distinguish one element, component, region, layer or portion from another element, component, region, layer or portion. Therefore, the first element, component, region, layer or portion discussed below may be represented as a second element, component, region, layer or portion, without departing from the teachings of the present application.

Spatial relationship terms such as "under", "below", "lower", "beneath", "above", "upper", etc. may be used here to conveniently describe the relationship between one element or feature shown in the figure and other element or feature. It should be understood that, in addition to the orientations shown in the figures, the spatial relationship terms also include different orientations of devices in use and operation. For example, if a device in the figure is turned over, an element or feature described as "below" or "under" or "beneath" other element will be oriented "on" the other element or feature. Therefore, the exemplary terms "below" and "under" may include both orientations of above and below. The device may be oriented otherwise (rotated 90 degrees or oriented in other ways), and the spatial terms used herein are interpreted accordingly.

The terms used here are only intended to describe specific embodiments and not to serve as limitations of the present application. When used here, the singular forms of "a", "an" and "said/the" also include plural forms, unless the context clearly indicates otherwise. It should also be understood that the terms "compose" and/or "include", when used in this specification, determine the existence of the described features, integers, steps, operations, elements and/or components, but do not exclude the existence or addition of one or more other features, integers, steps, operations, elements, components, and/or groups. As used herein, the term "and/or" includes any and all combinations of relevant listed items.

The embodiments of the application are described here with reference to cross-sectional views as schematic diagrams of ideal embodiments (and intermediate structures) of the present application. As such, changes in the shape shown due to, for example, manufacturing technology and/or tolerance can be expected. Therefore, the embodiments of the present application should not be limited to the specific shapes of the regions shown here, but include shape deviations due to, for example, manufacturing. The regions shown in the figures are schematic in nature, and their shapes are not intended to display the actual shapes of regions of a device and not intended to limit the scope of the present application.

In an embodiment of the present application, as shown in FIG. 1, a method for manufacturing a mask structure is provided, including the following steps:

Step S10: forming a pattern transfer layer, a first etching stop layer, a first sacrificial layer and a first hard mask layer sequentially stacked from bottom to top;

Step S20: patterning the first sacrificial layer and the first hard mask layer to obtain a first sacrificial pattern, the first sacrificial pattern exposing the first etching stop layer;

Step S30: forming a first initial mask pattern on side walls of the first sacrificial pattern;

Step S40: removing the first sacrificial pattern;

Step S50: removing, based on the first initial mask pattern, a part of the first etching stop layer of which a top surface being exposed;

Step S60: removing the first initial mask pattern, and using the remaining part of the first etching stop layer on the upper surface of the pattern transfer layer as a first mask pattern, the first mask pattern extending in a first direction; and Step S70: forming a second mask pattern on the first mask pattern, the second mask pattern extending in a second direction, and the second direction intersecting the first direction.

In the method for manufacturing a mask structure provided in the above embodiment, the first sacrificial layer and the first hard mask layer are patterned to obtain a first sacrificial pattern, the first sacrificial pattern exposing the first etching stop layer; a first initial mask pattern is formed on side walls of the first sacrificial pattern; the first sacrificial pattern is removed; a part of the first etching stop layer of which a top surface being exposed is removed based on the first initial mask pattern; the first initial mask pattern is removed, and the remaining part of the first etching stop layer on the upper surface of the pattern transfer layer is used as a first mask pattern, the first mask pattern extending in a first direction; and a second mask pattern is formed on the first mask pattern, the second mask pattern extending in a second direction, and the second direction intersecting the first direction, thus obtaining the mask structure with the first mask pattern and the second mask pattern having asymmetrical topographies, which eliminates the load effect caused by the difference in material selection ratio, so that when the patterns are transferred downward, a capacitor hole with a uniform diameter and a uniform diameter direction is obtained, which increases the storage capacity of a capacitor and improves the production yield of wafers.

Figure 2:
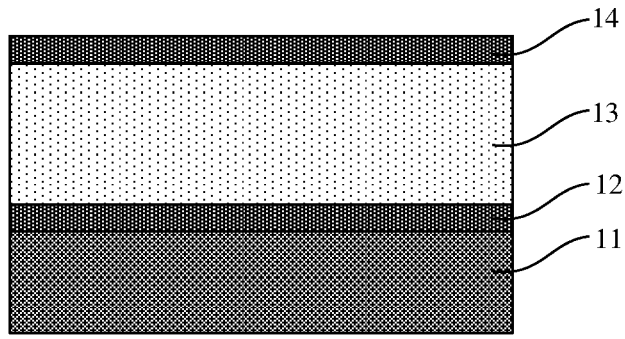
FIG. 2 is a partial cross-sectional structure diagram of forming a pattern transfer layer, a first etching stop layer, a first sacrificial layer and a first hard mask layer provided in an embodiment of the present application.

In an embodiment, as shown in FIG. 2, the pattern transfer layer 11 provided in step S10 may be multilayer for transferring mask patterns, and the pattern transfer layer 11 is etched using the first mask pattern and the second mask pattern as a mask to form a capacitor hole structure. The pattern transfer layer 11 may include a first pattern transfer layer, a second pattern transfer layer and a third pattern transfer layer sequentially stacked from bottom to top, wherein the first pattern transfer layer may include but is not limited to a polysilicon layer, the second pattern transfer layer may include but is not limited to a silicon oxide ($SiO_2$) layer, and the third pattern transfer layer may include but is not limited to an Amorphous Carbon Layer (ACL); the first etching stop layer 12 may include but is not limited to a silicon oxynitride layer (SiON), the first sacrificial layer 13 may include but is not limited to a Spin-On Hardmask (SOH) layer, and the first hard mask layer 14 may include but is not limited to a silicon oxynitride layer (SiON).

Figure 3:
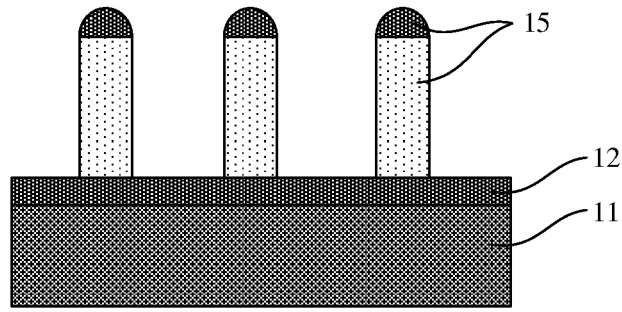
FIG. 3 is a partial cross-sectional structure diagram of forming a first sacrificial pattern provided in an embodiment of the present application.

In an embodiment, as shown in FIG. 3, in step S20, the first sacrificial pattern 15 distributed at equal intervals is formed on the upper surface of the first etching stop layer 12 by photolithography, and part of the first etching stop layer 12 is exposed; wherein, the first hard mask layer 14 is arc-shaped or rectangular, etc., and the present application takes arc-shaped as an example and is not limited thereto.

Figure 4:
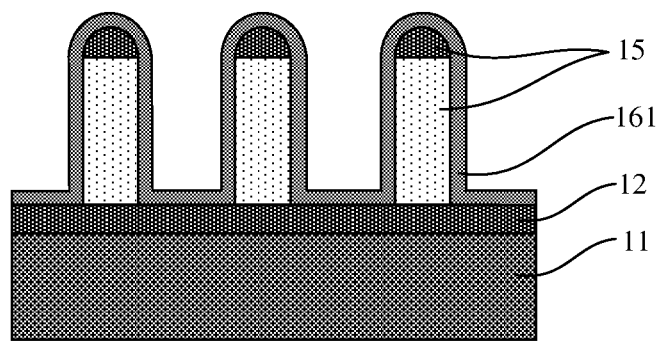
FIG. 4 is a partial cross-sectional structure diagram of forming a first initial mask material layer provided in an embodiment of the present application.

In an embodiment, step S30: forming a first initial mask pattern 16 on side walls of the first sacrificial pattern 15, includes the following steps:

Step S31: forming a first initial mask material layer 161 on the side walls of the first sacrificial pattern 15, the top surface of the first sacrificial pattern 15 and the upper surface of the exposed part of the first etching stop layer 12, as shown in FIG. 4;

As an example, the first initial mask material layer 161 is manufactured by Atomic Layer Deposition (ALD), and the first initial mask material layer 161 includes but is not limited to a silicon oxide layer.

Figure 5:
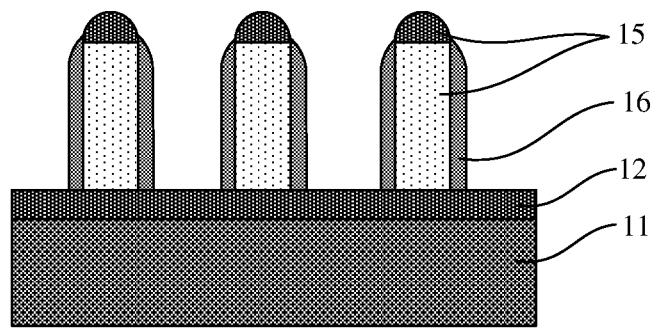
FIG. 5 is a partial cross-sectional structure diagram of forming a first initial mask pattern on side walls of the first sacrificial pattern provided in an embodiment of the present application.

Step S32: removing part of the first initial mask material layer 161 on the upper surface of the exposed part of the first etching stop layer 12 and the top surface of the first sacrificial pattern 15, to form the first initial mask pattern 16 on the side walls of the first sacrificial pattern 15, as shown in FIG. 5.

As an example, continuing to refer to FIG. 5, the first initial mask pattern 16 is a pattern with an asymmetric morphology, and the highest position of the first initial mask pattern 16 is flush with the upper surface of the patterned first sacrificial layer.

Figure 6:
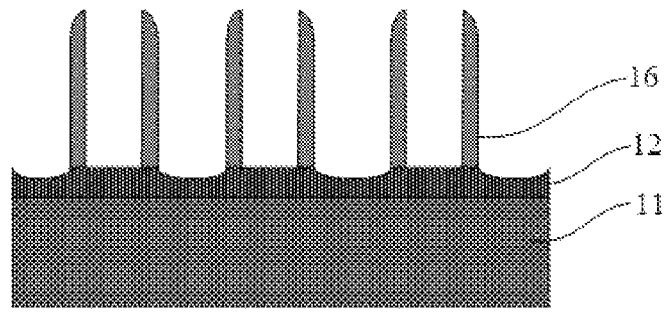
FIG. 6 is a partial cross-sectional schematic diagram of a structure obtained after removing the first sacrificial pattern provided in an embodiment of the present application.
Figure 7:
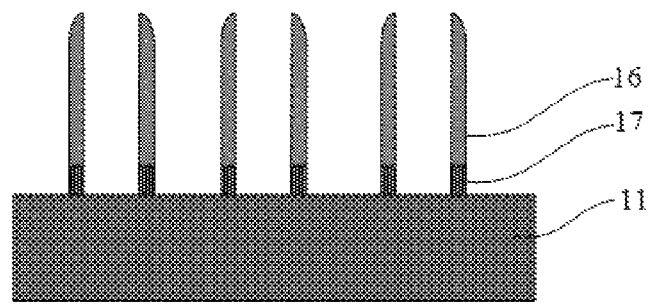
FIG. 7 is a partial cross-sectional schematic diagram of a structure obtained after removing a part of the first etching stop layer of which a top surface being exposed provided in an embodiment of the present application.

In an embodiment, the structure after removing the first sacrificial pattern 15 in step S40 refers to FIG. 6. Because the materials of both the first hard mask layer 14 and the first etching stop layer 12 are silicon oxynitride materials, while the patterned first hard mask layer 14 on the top surface is removed by etching, the exposed part of the first etching stop layer 12 is also etched, resulting in a depth difference between the first etching stop layer 12 below the first sacrificial pattern 15 and the exposed part of the first etching stop layer 12. After the first initial mask pattern 16 is obtained, the same etching process is used to continue to etch, based on the topography of the first initial mask pattern 16, a part of the first etching stop layer 12 of which a top surface being exposed, as shown in FIG. 7. The etching selection ratio of the first etching stop layer 12 to the pattern transfer layer 11 is 5:1 to 50:1; specifically, the etching selection ratio of the first etching stop layer 12 to the pattern transfer layer 11 is 5:1, 6:1, 10:1, 20:1, 30:1, 40:1, or 50:1.

Figure 8:
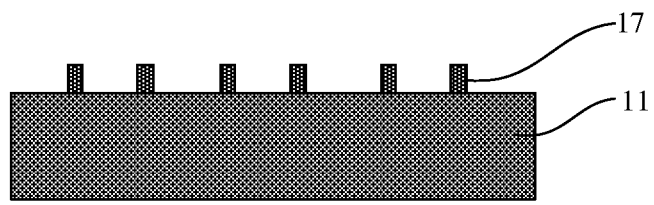
FIG. 8 is a partial cross-sectional structure diagram of removing the first initial mask pattern to form a first mask pattern provided in an embodiment of the present application.

As an example, the first initial mask pattern 16 is removed by a high-selectivity dry etching technology, without damaging the pattern transfer layer 11, and the remaining part of the first etching stop layer 12 on the upper surface of the pattern transfer layer 11 is used as the first mask pattern 17, as shown in FIG. 8. As an example, the first mask pattern 17 is a pattern with a symmetrical morphology, which facilitates subsequent transfer of the pattern to manufacture a capacitor hole structure with a uniform diameter.

Figure 9:
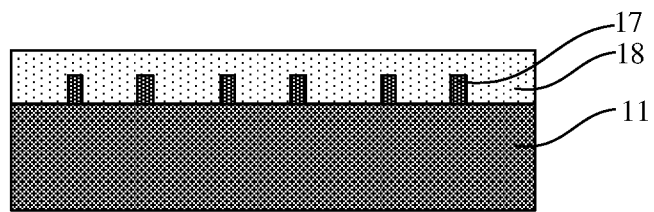
FIG. 9 is a partial cross-sectional structure diagram of forming a first filling layer provided in an embodiment of the present application.

In an embodiment, after forming the first mask pattern 17 in step S60 and before forming the second mask pattern 26 in step S70, the method further includes the following steps:

Step S601: forming a first filling layer 18, the first filling layer 18 covering the upper surface of the exposed part of the pattern transfer layer 11 and the first mask pattern 17, as shown in FIG. 9.

As an example, the upper surface of the first filling layer 18 is higher than that of the first mask pattern 17. The first filling layer 18 may be formed by a spin coating, and the first filling layer 18 may include, but is not limited to, a Spin-On Hardmask (SOH) layer.

In an embodiment, forming a second mask pattern 26 on the first mask pattern 17 in step S70 includes the following steps:

Step S71: forming a second etching stop layer 21, a second sacrificial layer 22 and a second hard mask layer 23 sequentially stacked from bottom to top on the upper surface of the first filling layer 18;

Step S72: patterning the second sacrificial layer 22 and the second hard mask layer 23 to form a second sacrificial pattern 24, the second sacrificial pattern 24 exposing the second etching stop layer 21;

Step S73: forming a second initial mask pattern 25 on side walls of the second sacrificial pattern 24; and Step S74: removing the second sacrificial pattern 24.

Figure 10:
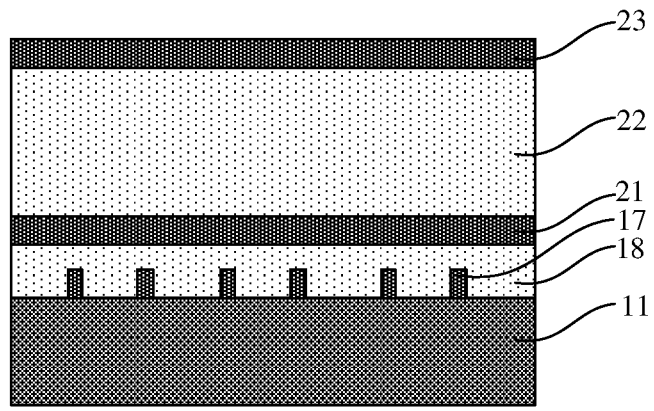
FIG. 10 is a partial cross-sectional structure diagram of forming a second etching stop layer, a second sacrificial layer and a second hard mask layer provided in an embodiment of the present application.
Figure 11:
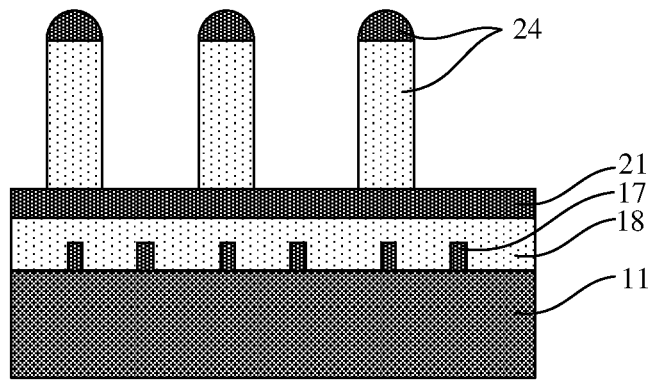
FIG. 11 is a partial cross-sectional structure diagram of forming a second sacrificial pattern provided in an embodiment of the present application.

For example, as shown in FIG. 10, the material of the second etching stop layer 21 formed in step S71 may be the same as that of the second hard mask layer 23, and the both may be SiON materials; the second sacrificial layer 22 may include, but is not limited to, a Spin-On Hardmask (SOH) layer. The step of patterning the second sacrificial layer 22 and the second hard mask layer 23 to obtain the second sacrificial pattern 24 is the same as that of the method for manufacturing the first sacrificial pattern 15, the second sacrificial pattern 24 distributed at equal intervals is also formed by photolithography, and a part of the second etching stop layer 21 is exposed, referring to FIG. 11; wherein, the second hard mask layer 23 is arc-shaped or rectangular, etc., and the present application takes arc-shaped as an example and is not limited thereto.

Figure 12:
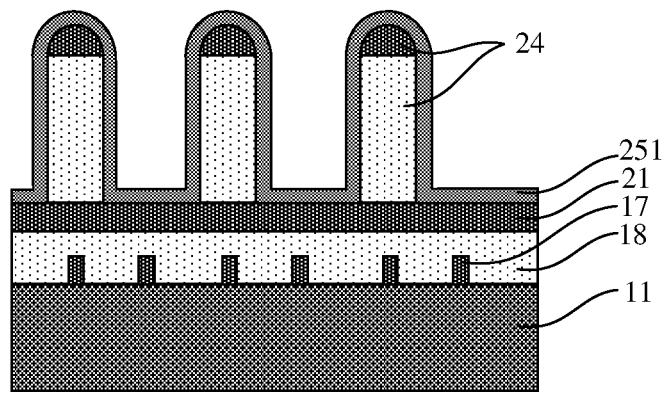
FIG. 12 is a partial cross-sectional structure diagram of forming a second initial mask material layer provided in an embodiment of the present application.

In an embodiment, step S73: forming a second initial mask pattern 25 on side walls of the second sacrificial pattern 24, includes the following steps:

Step S731: forming a second initial mask material layer 251 on the side walls of the second sacrificial pattern 24, the top surface of the second sacrificial pattern 24 and the upper surface of the exposed part of the second etching stop layer 21, as shown in FIG. 12;

As an example, the second initial mask material layer 251 is also manufactured by Atomic Layer Deposition (ALD), and the second initial mask material layer 251 includes but is not limited to a silicon oxide layer.

Figure 13:
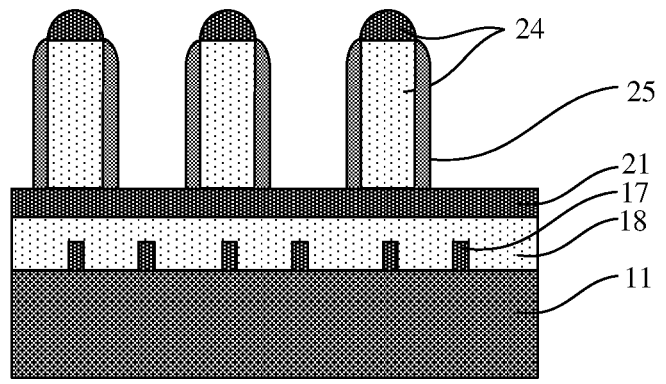
FIG. 13 is a partial cross-sectional structure diagram of forming a second initial mask pattern on side walls of the second sacrificial pattern provided in an embodiment of the present application.

Step S732: removing part of the second initial mask material layer 251 on the upper surface of the exposed part of the second etching stop layer 21 and the top surface of the second sacrificial pattern 24, to form the second initial mask pattern 25 on the side walls of the second sacrificial pattern 24, as shown in FIG. 13.

As an example, the second initial mask pattern 25 is a pattern with an asymmetric morphology, and the top position of the second initial mask pattern 25 is flush with the upper surface of the patterned second sacrificial layer 22.

Figure 14:
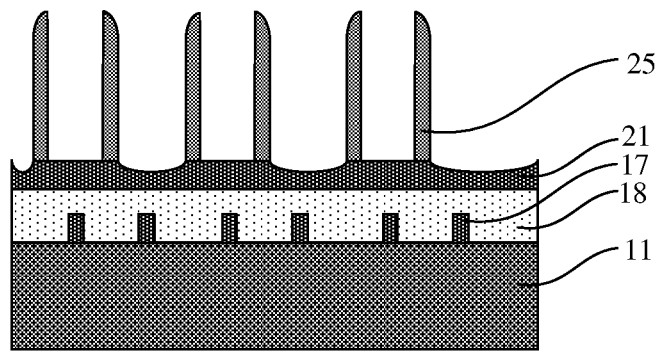
FIG. 14 is a partial cross-sectional schematic diagram of a structure obtained after removing the second sacrificial pattern provided in an embodiment of the present application.

In an embodiment, after the second sacrificial pattern is removed by dry etching to obtain the second etching stop layer 21 with a difference in depth as shown in FIG. 14, the second mask pattern is formed on the obtained second initial mask pattern 25 with asymmetric morphology, which will be explained in the following two solutions.

Figure 15:
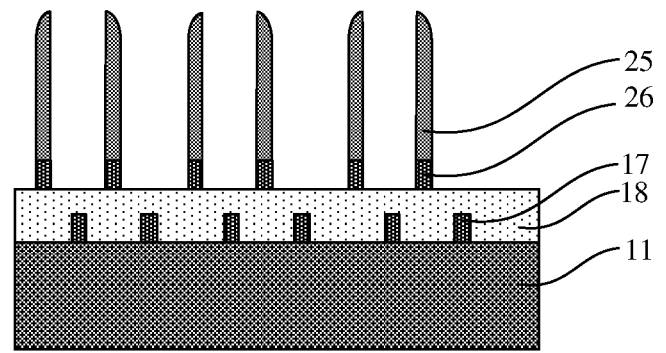
FIG. 15 is a partial cross-sectional schematic diagram of a structure obtained after removing a part of the second etching stop layer of which a top surface being exposed provided in an embodiment of the present application.

In the first solution for manufacturing the second mask pattern 26 provided by the present application, step S70: forming a second mask pattern 26 on the first mask pattern 17 further includes:

S75*a*: removing, based on the second initial mask pattern 25, a part of the second etching stop layer 21 of which a top surface being exposed, as shown in FIG. 15;

As an example, when the part of the second etching stop layer 21 of which a top surface being exposed is removed, the etching selection ratio of the second etching stop layer 21 to the first filling layer 18 is 3:1 to 10:1, so that after the part of the second etching stop layer 21 is removed, the first filling layer 18 under the second etching stop layer 21 will not be damaged. Specifically, the etching selection ratio of the second etching stop layer 21 to the first filling layer 18 is 3:1, 4:1, 5:1, 9:1, or 10:1.

Figure 16:
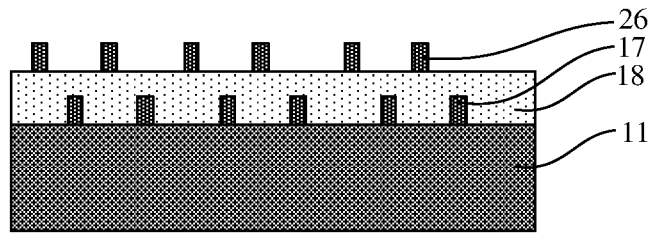
FIG. 16 is a partial cross-sectional structure diagram of removing the second initial mask pattern to form a second mask pattern provided in an embodiment of the present application.

S76*a*: removing the second initial mask pattern 25, and using the remaining part of the second etching stop layer 21 on the upper surface of the first filling layer 18 as the second mask pattern 26, as shown in FIG. 16.

As an example, the first technical solution for manufacturing the second mask pattern 26 is the same as the foregoing technical solution for manufacturing the first mask pattern 17.

Figure 17:
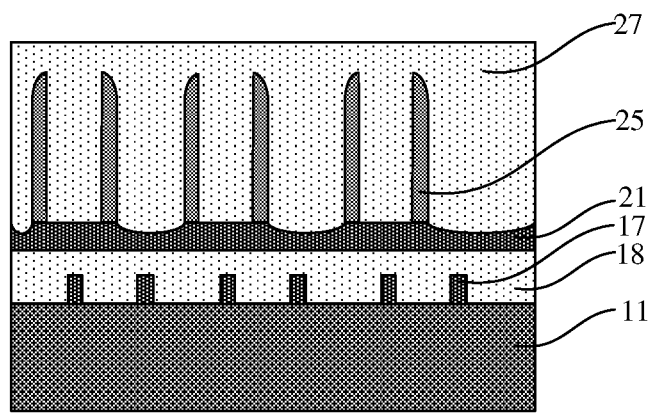
FIG. 17 is a partial cross-sectional structure diagram of forming a second filling layer provided in an embodiment of the present application.
Figure 18:
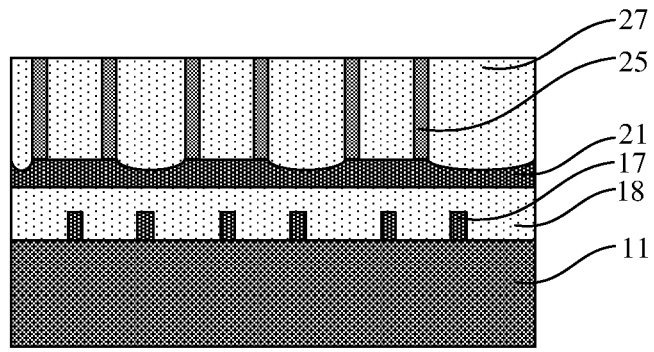
FIG. 18 is a partial cross-sectional schematic diagram of a structure obtained after removing a part of the second filling layer and a part of the second initial mask pattern provided in an embodiment of the present application.
Figure 19:
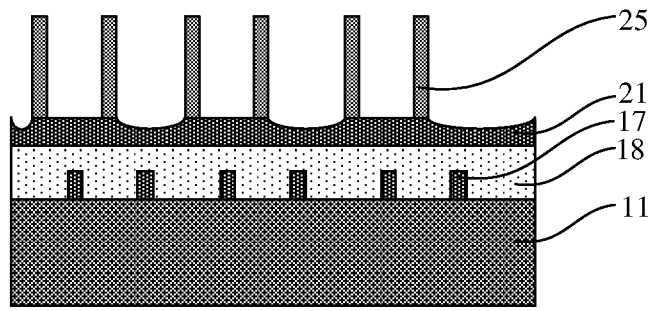
FIG. 19 is a partial cross-sectional schematic diagram of a structure obtained after removing the remaining part of the second filling layer provided in an embodiment of the present application.
Figure 20:
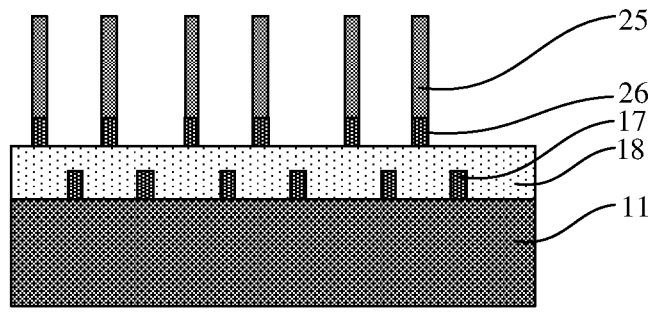
FIG. 20 is a partial cross-sectional schematic diagram of a structure obtained after removing a part of the second etching stop layer of which a top surface being exposed provided in another embodiment of the present application.
Figure 21:
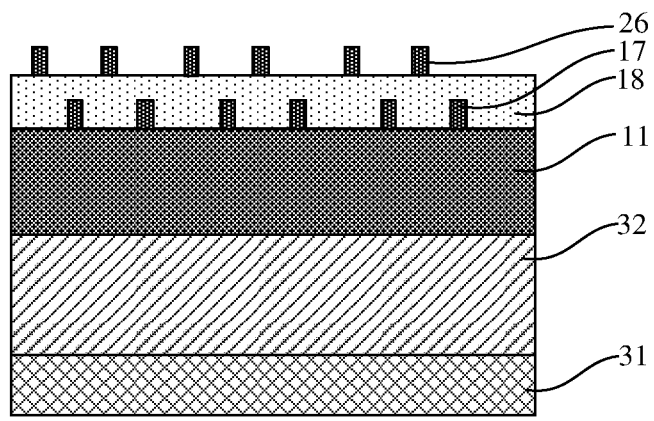
FIG. 21 is a partial cross-sectional structure diagram of a substrate and a to-be-etched material layer provided in another embodiment of the present application.

In the second solution for manufacturing the second mask pattern 26 provided by the present application, step S70: forming a second mask pattern 26 on the first mask pattern 17 further includes:

S75*b*: forming a second filling layer 27, the second filling layer 27 covering the upper surface of the exposed part of the second etching stop layer 21 and the second initial mask pattern 25, and the upper surface of the second filling layer 27 being higher than that of the second initial mask pattern 25, as shown in FIG. 17;

S76*b*: removing a part of the second filling layer 27 and a part of the second initial mask pattern 25, so that the upper surface of the remaining part of the second filling layer 27 and the upper surface of the remaining part of the second initial mask pattern 25 are flush and flat, and the asymmetric "ox horn" pattern on the top of the original second initial mask pattern 25 due to removing part of the second initial mask material layer 251 on the upper surface of the exposed part of the second etching stop layer 21 and the top surface of the second sacrificial pattern 24 in step S732 is flattened, as shown in FIG. 18;

S77*b*: removing the remaining part of the second filling layer 27, as shown in FIG. 19;

S78*b*: removing, based on the remaining part of the second initial mask pattern 25, the part of the second etching stop layer 21 of which a top surface being exposed, as shown in FIG. 20;

S79*b*: removing the remaining part of the second initial mask pattern 25, and using the remaining part of the second etching stop layer 21 on the upper surface of the first filling layer 27 as the second mask pattern 26, referring to FIG. 21.

In another embodiment, steps S77*b* to S79*b* are implemented in the same etching reaction chamber. The pattern is transferred to the first filling layer 18 by selectively etching away the remaining part of the second filling layer 27, the second etching stop layer 21 below the remaining part of the second filling layer 27 and the first filling layer 18 below the remaining part of the second filling layer 27, that is, using the remaining part of the second initial mask pattern 25 and the remaining part of the second etching stop layer 21 as a mask together. It should be noted that, the upper surface of the first filling layer 18 formed in step S601 is higher than the first mask pattern 17, the higher part is used as a buffer layer, and when the first filling layer 18 below the remaining second filling layer 27 continues to be etched downward after the second etching stop layer 21 below the remaining second filling layer 27 is removed by etching, because the material of the second etching stop layer 21 and the material of the first filling layer 18 have a relatively high etching selection ratio, the uneven "landform" in the original remaining part of the second initial mask pattern 25 is eliminated after etching to the buffer layer. It should be noted that the pattern transfer layer 11 may be formed on a substrate 31 whose surface is formed with a to-be-etched material layer 32. Specifically, the pattern transfer layer 11 is formed on the to-be-etched material layer 32.

As an example, the second filling layer 27 is formed by a spin coating, and the second filling layer 27 may include, but is not limited to, a Spin-On Hardmask (SOH) layer.

As an example, S76b: removing a part of the second filling layer 27 and a part of the second initial mask pattern 25 includes:

S761b: removing a part of the second filling layer 27 and a part of the second initial mask pattern 25 down the upper surface of the second filling layer 27 by a planarization or a back-etching.

As an example, the first mask pattern 17 extends in the first direction, the second mask pattern 26 is formed on the first mask pattern 17, the second mask pattern 26 extends in the second direction, the second direction intersects the first direction, and the intersection angle between the first direction and the second direction is greater than 0° and less than or equal to 90°; specifically, the intersection angle between the first direction and the second direction is 10°, 20°, 30°, 40°, 50°, or 90°.

As an example, the second mask pattern 26 with symmetrical morphology can be obtained through the first solution and the second solution, and the depth difference caused by the difference in material selection ratio can be avoided, which is beneficial to the subsequent transfer of patterns to manufacture a capacitor hole structure with a uniform diameter, and the capacitor hole will not be misaligned.

In an embodiment, after step S70: forming a second mask pattern 26 on the first mask pattern 17, the method further includes:

Step S80: patterning the pattern transfer layer 11 based on the first mask pattern 17 and the second mask pattern 26 to obtain a target mask pattern 33.

Figure 22:
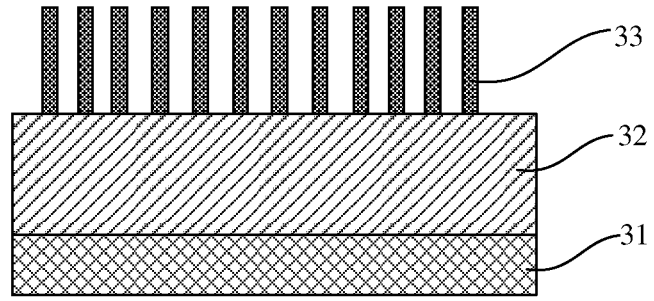
FIG. 22 is a partial cross-sectional structure diagram of forming a target mask pattern on the upper surface of a to-be-etched material layer provided in an embodiment of the present application.

In an embodiment, step S80: patterning the pattern transfer layer based on the first mask pattern 17 and the second mask pattern 26 to obtain a target mask pattern includes:

Step S81: removing a part of the first filling layer 18 by etching with using the second mask pattern 26 as a mask, to transfer the pattern of the second mask pattern 26 to the first filling layer 18;

Step S82: etching the pattern transfer layer 11 with using the pattern transferred by the second mask pattern 26 in the first filling layer 18 and the first mask pattern 17 as a mask; and Step S83: removing the first mask pattern 17, the second mask pattern 26 and the remaining part of the first filling layer 18 to obtain the target mask pattern 33, as shown in FIG. 22.

Figure 23:
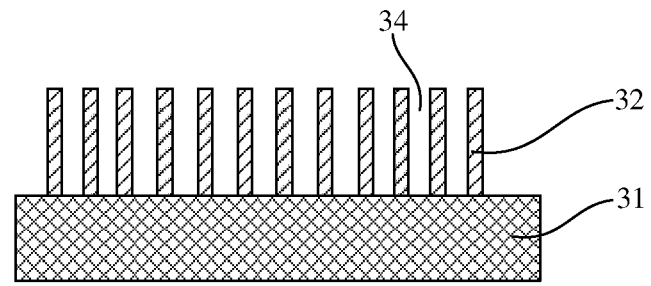
FIG. 23 is a structural schematic diagram of a semiconductor structure provided in another embodiment of the present application.

In an embodiment of the present application, a method for manufacturing a semiconductor structure is further provided, including the following steps:

Step S1: providing a substrate 31;
Step S2: forming a to-be-etched material layer 32 on the substrate 31;
Step S3: forming a target mask pattern 33 on the upper surface of the to-be-etched material layer 32 by using the above-mentioned method for manufacturing a mask structure, as shown in FIG. 22; and Step S4: etching the to-be-etched material layer 32 based on the target mask pattern 33 to form a plurality of blind holes 34; wherein the structure after the target mask pattern 33 is removed is shown in FIG. 23.

In the method for manufacturing a semiconductor structure provided in the foregoing embodiment, a substrate is provided; a to-be-etched material layer is formed on the substrate; a target mask pattern is formed on the upper surface of the to-be-etched material layer by using the above-mentioned method for manufacturing a mask structure; and the to-be-etched material layer is etched based on the target mask pattern to form a plurality of blind holes with uniform diameter and uniform diameter direction, which increases the storage capacity of capacitors, improves the production yield of wafers, and facilitates the manufacturing of capacitor holes of small-sized DRAM.

As an example, the surface of the substrate 31 has a conductive contact pad, and the to-be-etched material layer 32 includes a dielectric layer; the blind holes 34 include capacitor holes, and the bottoms of the blind holes 34 expose the conductive contact pad.

In an embodiment of the present application, the present application further proposes a semiconductor structure, which is manufactured by the above-mentioned method for manufacturing a semiconductor structure.

It should be noted that the above-mentioned embodiments are only for illustrative purposes and do not mean to limit the present application.

It should be understood that, unless explicitly described herein, the execution of the steps is not limited to a strict order, instead, the steps may be executed in other order. In addition, at least some of the steps may include a plurality of sub-steps or a plurality of stages. These sub-steps or stages are not necessarily executed at the same time, but can be executed at different time. These sub-steps or stages are also not necessarily executed in succession, but can be executed in turn or alternately with at least some other steps or sub-steps or stages of other steps.

The embodiments in this specification are all described in a progressive manner. Each embodiment focuses on the differences from other embodiments, and the same or similar parts between the embodiments may be referred to each other.

The technical features of the above-mentioned embodiments may be combined arbitrarily. For the purpose of simplicity in description, all the possible combinations of the technical features in the above embodiments are not described. However, as long as the combinations of these technical features do not have contradictions, they shall fall within the scope of this specification.

The invention claimed is:

1. A method for manufacturing a mask structure, comprising:
forming a pattern transfer layer, a first etching stop layer, a first sacrificial layer and a first hard mask layer sequentially stacked from bottom to top;
patterning the first sacrificial layer and the first hard mask layer, to obtain a first sacrificial pattern, the first sacrificial pattern exposing the first etching stop layer;
forming a first initial mask pattern on side walls of the first sacrificial pattern;
removing the first sacrificial pattern;
removing, based on the first initial mask pattern, a part of the first etching stop layer of which a top surface being exposed;

removing the first initial mask pattern, and using a remaining part of the first etching stop layer on an upper surface of the pattern transfer layer as a first mask pattern, the first mask pattern extending in a first direction;

forming a first filling layer, the first filling layer covering an upper surface of an exposed part of the pattern transfer layer and the first mask pattern, wherein an upper surface of the first filling layer is higher than an upper surface of the first mask pattern; and forming a second mask pattern on the first mask pattern, the second mask pattern extending in a second direction, and the second direction intersecting the first direction; and, wherein forming the second mask pattern on the first mask pattern comprises:

forming a second etching stop layer, a second sacrificial layer and a second hard mask layer sequentially stacked from bottom to top on the upper surface of the first filling layer;

patterning the second sacrificial layer and the second hard mask layer, to form a second sacrificial pattern, the second sacrificial pattern exposing the second etching stop layer;

forming a second initial mask pattern on side walls of the second sacrificial pattern; and removing the second sacrificial pattern.

2. The method according to claim 1, wherein the forming a first initial mask pattern on side walls of the first sacrificial pattern comprises:

forming a first initial mask material layer on the side walls of the first sacrificial pattern, a top surface of the first sacrificial pattern and an upper surface of an exposed part of the first etching stop layer; and removing a part of the first initial mask material layer on the upper surface of the exposed part of the first etching stop layer and the top surface of the first sacrificial pattern, to form the first initial mask pattern on the side walls of the first sacrificial pattern.

3. The method according to claim 1, wherein the forming a second initial mask pattern on side walls of the second sacrificial pattern comprises:

forming a second initial mask material layer on the side walls of the second sacrificial pattern, a top surface of the second sacrificial pattern and an upper surface of an exposed part of the second etching stop layer; and removing a part of the second initial mask material layer on the upper surface of the exposed part of the second etching stop layer and the top surface of the second sacrificial pattern, to form the second initial mask pattern on the side walls of the second sacrificial pattern.

4. The method according to claim 3, wherein the forming a second mask pattern on the first mask pattern further comprises:

removing, based on the second initial mask pattern, a part of the second etching stop layer of which a top surface being exposed; and removing the second initial mask pattern, and using a remaining part of the second etching stop layer on the upper surface of the first filling layer as the second mask pattern.

5. The method according to claim 3, wherein the forming a second mask pattern on the first mask pattern further comprises:

forming a second filling layer, the second filling layer covering the upper surface of the exposed part of the second etching stop layer and the second initial mask pattern, and an upper surface of the second filling layer being higher than an upper surface of the second initial mask pattern;

removing a part of the second filling layer and a part of the second initial mask pattern, so that an upper surface of a remaining part of the second filling layer and an upper surface of a remaining part of the second initial mask pattern are flush and flat;

removing the remaining part of the second filling layer;

removing, based on the remaining part of the second initial mask pattern, the part of the second etching stop layer of which a top surface being exposed; and removing the remaining part of the second initial mask pattern, and using a remaining part of the second etching stop layer on the upper surface of the first filling layer as the second mask pattern.

6. The method according to claim 5, wherein the removing a part of the second filling layer and a part of the second initial mask pattern comprises:

removing a part of the second filling layer and a part of the second initial mask pattern down the upper surface of the second filling layer by a planarization or a back-etching.

7. The method according to claim 5, wherein the second filling layer and the first filling layer are both formed by a spin coating.

8. The method according to claim 4, wherein when the part of the second etching stop layer of which a top surface being exposed is removed, an etching selection ratio of the second etching stop layer to the first filling layer is 3:1 to 10:1.

9. The method according to claim 1, wherein when the part of the first etching stop layer of which a top surface being exposed is removed, an etching selection ratio of the first etching stop layer to the pattern transfer layer is 5:1 to 50:1.

10. The method according to claim 4, wherein after the forming a second mask pattern on the first mask pattern, the method further comprises:

patterning the pattern transfer layer based on the first mask pattern and the second mask pattern to obtain a target mask pattern.

11. The method according to claim 10, wherein the patterning the pattern transfer layer based on the first mask pattern and the second mask pattern to obtain a target mask pattern comprises:

removing a part of the first filling layer by etching with using the second mask pattern as a mask, to transfer a pattern of the second mask pattern to the first filling layer;

etching the pattern transfer layer with using a pattern transferred by the second mask pattern in the first filling layer and the first mask pattern as a mask; and removing the first mask pattern, the second mask pattern and a remaining part of the first filling layer, to obtain the target mask pattern.

12. A method for manufacturing a semiconductor structure, comprising providing a substrate;

forming a to-be-etched material layer on the substrate;

forming a target mask pattern on upper surface of the to-be-etched material layer by using the method according to claim 10; and etching the to-be-etched material layer based on the target mask pattern, to form a plurality of blind holes.

13. The method according to claim 12, wherein a surface of the substrate has a conductive contact pad, and the to-be-etched material layer comprises a dielectric layer.

14. The method according to claim 13, wherein the blind holes comprise capacitor holes, bottoms of the blind holes expose the conductive contact pad.

15. The method according to claim 5, wherein after the forming a second mask pattern on the first mask pattern, the method further comprises:
   patterning the pattern transfer layer based on the first mask pattern and the second mask pattern to obtain a target mask pattern.

16. A method for manufacturing a semiconductor structure, comprising
   providing a substrate;
   forming a to-be-etched material layer on the substrate;
   forming a target mask pattern on upper surface of the to-be-etched material layer by using the method according to claim 11; and
   etching the to-be-etched material layer based on the target mask pattern, to form a plurality of blind holes.

17. A semiconductor structure, manufactured by the method according to claim 12.

* * * * *